US 11,676,949 B2

(12) United States Patent
Choi et al.

(10) Patent No.: US 11,676,949 B2
(45) Date of Patent: Jun. 13, 2023

(54) SEMICONDUCTOR PACKAGES HAVING SUPPORTING MEMBERS

(71) Applicant: SAMSUNG ELECTRONICS CO., LTD., Suwon-si (KR)

(72) Inventors: Taeseok Choi, Seoul (KR); Jihwang Kim, Cheonan-si (KR); Jongbo Shim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 17/370,149

(22) Filed: Jul. 8, 2021

(65) Prior Publication Data

US 2022/0173081 A1 Jun. 2, 2022

(30) Foreign Application Priority Data

Dec. 1, 2020 (KR) .................. 10-2020-0165841

(51) Int. Cl.
| | |
|---|---|
| *H01L 25/10* | (2006.01) |
| *H01L 23/498* | (2006.01) |
| *H01L 23/538* | (2006.01) |
| *H01L 23/31* | (2006.01) |

(52) U.S. Cl.
CPC ........ *H01L 25/105* (2013.01); *H01L 23/3128* (2013.01); *H01L 23/49822* (2013.01); *H01L 23/49833* (2013.01); *H01L 23/5383* (2013.01); *H01L 23/5385* (2013.01); *H01L 23/5389* (2013.01)

(58) Field of Classification Search
CPC .............. H01L 25/105; H01L 23/3128; H01L 23/49822; H01L 23/49833; H01L 23/5383; H01L 23/5385; H01L 23/5389
See application file for complete search history.

(56) References Cited

U.S. PATENT DOCUMENTS

| | | | |
|---|---|---|---|
| 9,899,305 B1* | 2/2018 | Yeh .................... | H01L 23/5385 |
| 9,911,685 B2 | 3/2018 | Lee et al. | |
| 10,483,217 B2 | 11/2019 | Haba et al. | |
| 2010/0027225 A1* | 2/2010 | Yuda .................... | H05K 3/4697 |
| | | | 156/247 |

(Continued)

FOREIGN PATENT DOCUMENTS

JP 2013118364 6/2013

*Primary Examiner* — Fernando L Toledo
*Assistant Examiner* — Neil R Prasad
(74) *Attorney, Agent, or Firm* — F. Chau & Associates, LLC

(57) ABSTRACT

A semiconductor package includes a lower substrate including a lower passivation layer, a lower pad, element pads and a supporting pad that are disposed on a lower surface of the lower substrate. The lower passivation layer partially covers the lower pad, the element pads and the supporting pad. A semiconductor chip is disposed on an upper surface of the lower substrate. An upper substrate is disposed on the semiconductor chip and is connected to the lower substrate. An encapsulator is disposed between the lower substrate and the upper substrate. An element is disposed on the lower surface of the lower substrate. The element is bonded to the element pads. A lower supporting member is disposed on the lower surface of the lower substrate. A supporting bonding member bonds the lower supporting member to the supporting pad.

20 Claims, 18 Drawing Sheets

(56) References Cited

U.S. PATENT DOCUMENTS

| | | | |
|---|---|---|---|
| 2010/0147560 A1* | 6/2010 | Kaneko | H01L 23/13 |
| | | | 174/250 |
| 2016/0172277 A1 | 6/2016 | Lee et al. | |
| 2018/0130719 A1* | 5/2018 | Fang | H01L 21/52 |
| 2018/0261556 A1 | 9/2018 | Haba et al. | |
| 2018/0342476 A1 | 11/2018 | Wirz et al. | |
| 2019/0259713 A1 | 8/2019 | Li et al. | |
| 2020/0105544 A1 | 4/2020 | Tsai et al. | |
| 2020/0144226 A1 | 5/2020 | Chen | |
| 2021/0202392 A1* | 7/2021 | Kung | H01L 23/5386 |

* cited by examiner

SEMICONDUCTOR PACKAGES HAVING SUPPORTING MEMBERS

CROSS-REFERENCE TO THE RELATED APPLICATION

This application claims priority under 35 U.S.C. § 119 to Korean Patent Application No. 10-2020-0165841, filed on Dec. 1, 2020 in the Korean Intellectual Property Office, the disclosure of which is incorporated by reference in its entirety herein.

TECHNICAL FIELD

Embodiments of the present inventive concepts relate to semiconductor packages having supporting members.

DISCUSSION OF RELATED ART

As semiconductor devices have become increasingly miniaturized, package-on-package technology for mounting a semiconductor package on another semiconductor package has been introduced. In a semiconductor package having a relatively light, thin, simple and miniaturized structure, the semiconductor package may experience warpage due to heat.

SUMMARY

Embodiments of the present inventive concepts provide a semiconductor package having a lower supporting member disposed under a lower substrate.

According to an embodiment of the present inventive concepts, a semiconductor package includes a lower substrate including a lower passivation layer, a lower pad, element pads and a supporting pad that are disposed on a lower surface of the lower substrate. The lower passivation layer partially covers the lower pad, the element pads and the supporting pad. A semiconductor chip is disposed on an upper surface of the lower substrate. An upper substrate is disposed on the semiconductor chip and is connected to the lower substrate. An encapsulator is disposed between the lower substrate and the upper substrate. An element is disposed on the lower surface of the lower substrate. The element is bonded to the element pads. A lower supporting member is disposed on the lower surface of the lower substrate. A supporting bonding member bonds the lower supporting member to the supporting pad.

According to an embodiment of the present inventive concepts, a semiconductor package includes a lower substrate including a lower passivation layer, a lower pad, element pads and a supporting pad that are disposed on a lower surface of the lower substrate. The lower passivation layer partially covers the lower pad, the element pads and the supporting pad. A semiconductor chip is disposed on an upper surface of the lower substrate. An upper substrate is disposed on the semiconductor chip and is connected to the lower substrate. An encapsulator is disposed between the lower substrate and the upper substrate. An element is disposed on the lower surface of the lower substrate and is bonded to the element pads. A first lower supporting member is disposed on the lower surface of the lower substrate. A second lower supporting member is disposed on the upper surface of the lower substrate. A first supporting bonding member bonds the first lower supporting member to the supporting pad.

According to an embodiment of the present inventive concepts, a semiconductor package includes a first package including a lower substrate including a lower passivation layer, a lower pad, element pads and a supporting pad that are disposed on a lower surface of the lower substrate. The lower passivation layer partially covers the lower pad, the element pads and the supporting pad. A first semiconductor chip is disposed on an upper surface of the lower substrate. An upper substrate is disposed on the first semiconductor chip and is connected to the lower substrate. An encapsulator is disposed between the lower substrate and the upper substrate. An element is disposed on the lower surface of the lower substrate. The element is bonded to the element pads. A lower supporting member is disposed on the lower surface of the lower substrate. A supporting bonding member bonds the lower supporting member to the supporting pad. A second package is disposed on the first package. The second package includes a package substrate, a second semiconductor chip disposed on the package substrate, and a package connecting terminal interconnecting the package substrate and the upper substrate.

According to an embodiment of the present inventive concepts, a semiconductor package includes a lower substrate including a lower passivation layer, a lower pad, element pads and at least one supporting pad. A semiconductor chip is disposed on the lower substrate. An upper substrate is disposed on the semiconductor chip and is connected to the lower substrate. An element is disposed on the lower substrate. The element is bonded to the element pads. At least one supporting member is disposed on the lower substrate. Each of the at least one supporting member is respectively connected to the at least one supporting pad through a supporting bonding member. The at least one supporting member includes a material having a higher or lower coefficient of thermal expansion than other portions of the semiconductor package to reduce warpage of the semiconductor package.

DETAILED DESCRIPTION OF EMBODIMENTS

Figure 1:
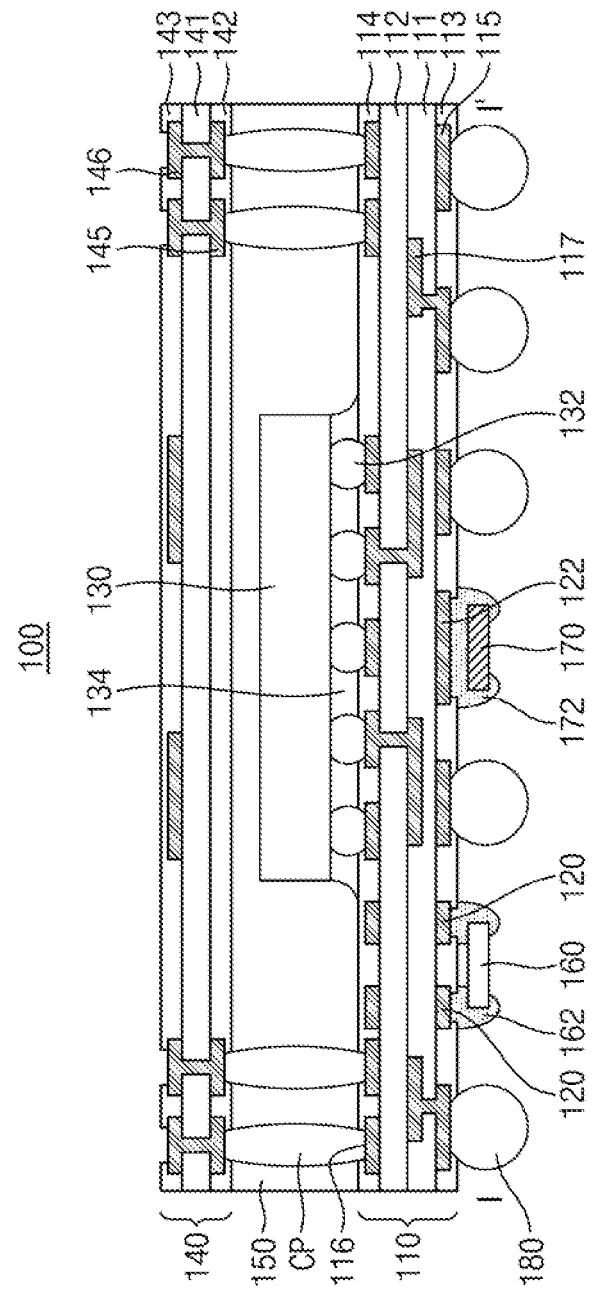
FIG. 1 is a cross-sectional view of a semiconductor package taken along line I-I' of FIG. 2 according to an embodiment of the present inventive concepts.
Figure 2:
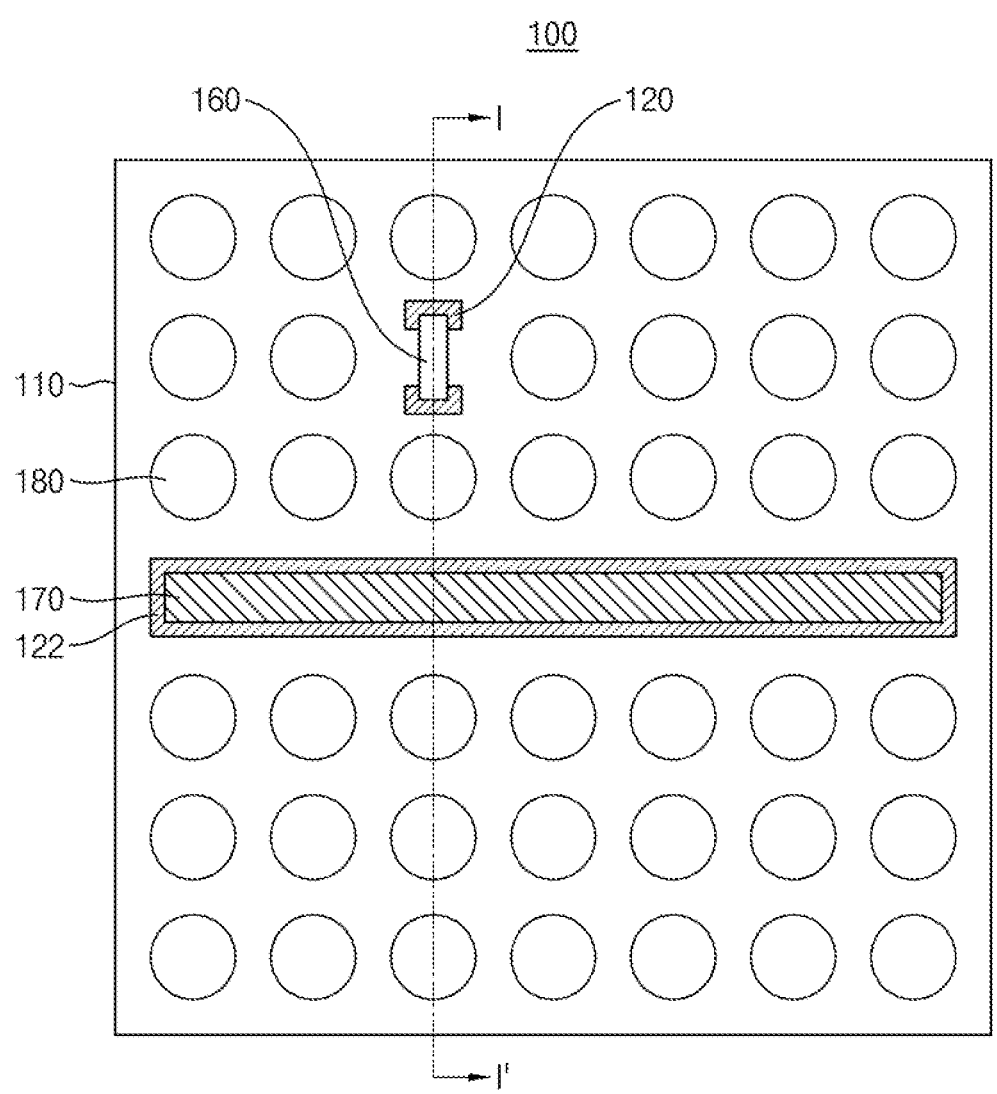
FIG. 2 is a plan view of the semiconductor package shown in FIG. 1 according to an embodiment of the present inventive concepts.

FIG. 1 is a vertical cross-sectional view of a semiconductor package according to an embodiment of the present inventive concepts. FIG. 2 is a plan view of the semiconductor package shown in FIG. 1. For example, FIG. 1 may correspond to a vertical cross-sectional view of a semiconductor package 100 taken along line I-I' in FIG. 2.

Referring to the embodiment of FIG. 1, the semiconductor package 100 may include a lower substrate 110, an element pad 120, a supporting pad 122, a semiconductor chip 130, an upper substrate 140, a conductive pillar CP, an encapsulator 150, an element 160, a lower supporting member 170, and an external connecting terminal 180.

As shown in the embodiment of FIG. 1, the lower substrate 110 may include a first insulating layer 111, a second insulating layer 112, a lower passivation layer 113, an upper passivation layer 114, a lower pad 115, an upper pad 116, and a wiring 117. The second insulating layer 112 may be disposed on the first insulating layer 111. For example, in an embodiment, a lower surface of the second insulating layer 112 may directly contact an upper surface of the first insulating layer 111. The lower passivation layer 113 may be disposed at a lower side of the first insulating layer 111. For example, in an embodiment, an upper surface of the lower passivation layer 113 may directly contact a lower surface of the first insulating layer 111. The upper passivation layer 114 may be disposed at an upper side of the second insulating layer 112. For example, a lower surface of the upper passivation layer 114 may directly contact an upper surface of the second insulating layer 112. The lower pad 115 may be disposed on a lower side of the first insulating layer 111, and may be partially covered by the lower passivation layer 113. The upper pad 116 may be disposed on the upper side of the second insulating layer 112, and may be partially covered by the upper passivation layer 114. The wiring 117 may be disposed in the first insulating layer 111 and the second insulating layer 112, and may be electrically connected to the lower pad 115 or the upper pad 116.

In an embodiment, the lower substrate 110 may be a printed circuit board. In an embodiment, the first insulating layer 111 and the second insulating layer 112 may include an insulating material such as a phenolic resin, an epoxy resin, prepreg, etc. However, embodiments of the present inventive concepts are not limited thereto and the materials and structure of the first and second insulating layers 111, 112 may vary. For example, in an embodiment, the lower substrate 10 may be a redistribution layer having a stacked structure of an insulating material and a conductive material.

The lower substrate 110 may further include the element pad 120 and the supporting pad 122 disposed on a lower surface thereof. For example, as shown in the embodiment of FIG. 1, upper surfaces of the element pad 120 and the supporting pad 122 may directly contact a lower surface of the first insulating layer 111. The element pad 120 and the supporting pad 122 may be partially covered by the lower passivation layer 113. For example, in an embodiment, partial portions of the bottom surfaces of the element pad 120 and the supporting pad 122 may be exposed by the lower passivation layer 113. Lowermost surfaces of the element pad 120 and the supporting pad 122 may be disposed at a higher level than a lowermost surface of the lower passivation layer 113. For example, the element pad 120 and the supporting pad 122 may be partially exposed, and may be connected to the element 160 and the lower supporting member 170, respectively, as will be described later. Upper surfaces of the element pad 120 and the supporting pad 122 may be disposed at the same level as an upper surface of the lower pad 115 (e.g., in a thickness direction of the lower substrate 110).

The semiconductor chip 130 may be disposed on the lower substrate 110. In an embodiment, the semiconductor chip 130 may be mounted on the lower substrate 110 through flip-chip bonding. For example, the semiconductor package 100 may further include a chip connecting terminal 132 interconnecting the semiconductor chip 130 and the lower substrate 110, and an underfill 134 at a lower side of the semiconductor chip 130. The chip connecting terminal 132 may be disposed at the lower side of the semiconductor chip 130, and may directly contact the upper pad 116. The underfill 134 may cover the chip connecting terminal 132, and fill a space between the lower substrate 110 and the semiconductor chip 130. However, embodiments of the present inventive concepts are not limited thereto. The underfill 134 may protect the chip connecting terminal 132. In an embodiment, the semiconductor chip 130 may be mounted on the lower substrate 110 through wire bonding.

The upper substrate 140 may be disposed on the lower substrate 110 and the semiconductor chip 130. For example, the upper substrate 140 may be electrically connected to the lower substrate 110 by the conductive pillar CP which extends vertically (e.g., in a thickness direction of the lower substrate 110). As shown in the embodiment of FIG. 1, the upper substrate 140 may include a third insulating layer 141, a lower passivation layer 142, an upper passivation layer 143, a lower pad 145, and an upper pad 146. The lower passivation layer 142 and the upper passivation layer 143 may be disposed on lower and upper sides of the third insulating layer 141, respectively. As shown in the embodiment of FIG. 1, the lower pad 145 may be disposed on the lower side of the third insulating layer 141. For example, an upper surface of the lower pad 145 may directly contact a lower surface of the third insulating layer 141. The lower pad 145 may be partially covered by the lower passivation layer 142. For example, in an embodiment, a partial portion of the lower surface of the lower pad 145 may be exposed by the lower passivation layer 142. The upper pad 146 may be disposed on the upper side of the third insulating layer 141. For example, a lower surface of the upper pad 146 may directly contact an upper surface of the third insulating layer 141. The upper pad 146 may be partially covered by the upper passivation layer 143. For example, a partial portion of the upper surface of the upper pad 146 may be exposed by the upper passivation layer 143. The lower pad 145 may be electrically connected to the upper pad 146.

The conductive pillar CP may be electrically connected to the lower substrate 110 and the upper substrate 140. For example, the conductive pillar CP may be connected to the upper pad 116 of the lower substrate 110 and the lower pad 145 of the upper substrate 140. In an embodiment, the height (e.g., length in a thickness direction of the lower substrate 110) of the conductive pillar CP may be greater than the height of the semiconductor chip 130. For example, an upper surface of the conductive pillar CP may be disposed at a higher level than an upper surface of the semiconductor chip 130 (e.g., in a thickness direction of the lower substrate 110), and the upper surface of the semiconductor chip 130 may not directly contact the upper substrate 140.

In an embodiment, the upper substrate 140 may be a printed circuit board. However, embodiments of the present inventive concepts are not limited thereto and the upper substrate 140 may be various different structures, such as a redistribution layer having a stacked structure of an insulating material and a conductive material, etc.

The encapsulator 150 may fill a space between the lower substrate 110 and the upper substrate 140. For example, the encapsulator 150 may cover the lower substrate 110, the semiconductor chip 130 and the conductive pillar CP. For example, in an embodiment, the encapsulator 150 may cover an upper surface of the lower substrate 110, an upper surface and lateral side surfaces of the semiconductor chip 130 and lateral side surfaces of the conductive pillar CP. The encapsulator 150 may protect the semiconductor chip 130 and the conductive pillar CP.

The element 160 and the lower supporting member 170 may be disposed under the lower substrate 110. For example, as shown in the embodiment of FIG. 1, the element 160 may be bonded to the element pad 120 of the lower substrate 110 by an element bonding member 162. In an embodiment, the element 160 may include an active element such as a transistor and/or a passive element such as an inductor, a resistor, a capacitor, etc. However, embodiments of the present inventive concepts are not limited thereto. The element 160 may be electrically connected to the element pad 120 by the element bonding member 162. In an embodiment, the element bonding member 162 may include solder.

The lower supporting member 170 may be bonded to the supporting pad 122 of the lower substrate 110 by a supporting bonding member 172. In an embodiment, the lower supporting member 170 may be connected to one support pad 122. For example, the supporting bonding member 172 may fill a space (e.g., in a thickness direction of the lower substrate 110) between the lower supporting member 170 and the supporting pad 122. In an embodiment, the supporting bonding member 172 may partially cover a lower surface of the supporting pad 122. In an embodiment, the supporting bonding member 172 may cover an upper surface, side surfaces and a partial portion of a bottom surface of the lower supporting member 170. The lower supporting member 170 may prevent or reduce warpage of the semiconductor package 100. For example, in an embodiment, the lower supporting member 170 may include a material having a higher or lower coefficient of thermal expansion (CTE) than other portions of the semiconductor package 100. The lower supporting member 170 may have a CTE different from that of the other portions of the semiconductor package 100 and, as such, may control warpage of the semiconductor package 100. In an embodiment in which the lower supporting member 170 includes a conductive material, the lower supporting member 170 may be electrically connected to the supporting pad 122 by the supporting bonding member 172. The supporting pad 122 may attach the lower supporting member 170 to the lower substrate 110, but may not be electrically connected to other configurations of the semiconductor package 100. For example, in an embodiment, the supporting pad 122 may be a dummy pad, and may not be electrically connected to the lower pad 115, the upper pad 116, the wiring 117, the element 160 and the external connecting terminal 180. In an embodiment, the supporting bonding member 172 may include the same material as the element bonding member 162. For example, the supporting bonding member 172 may include solder.

Referring to the embodiment of FIG. 2, the element pad 120, which is connected to the element 160, may be disposed at opposite ends of the element 160 (e.g., opposite lateral ends of the element 160). However, when viewed in a plan view, the supporting pad 122, which is connected to the lower supporting member 170, may be disposed not only at opposite ends of the lower supporting member 170, but also at other portions of the lower supporting member 170. For example, the support pad 122 may extend in a longitudinal extending direction of the lower supporting member 170. Here, the longitudinal extending direction may mean a direction along a longitudinal axis of the lower supporting member 170. When viewed in a plan view, the supporting pad 122 may surround the lower supporting member 170. For example, the supporting pad 122 may completely surround the lower supporting member 170 in a plan view. A side surface of the lower supporting member 170 may be disposed inside a side surface of the lower substrate 110 to secure a space in which the supporting pad 122 connected to the lower supporting member 170 may be disposed.

In an embodiment, the lower supporting member 170 may include a ceramic such as $SiO_2$, cordierite, $Si_3N_4$, SiC, AlN, mullite, TiN, TiC, $Al_2O_3$, $TiO_2$, PSZ $ZrO_2$, cubic $ZrO_2$, and MgO and/or a metal such as tungsten (W), Kovar, molybdenum (Mo), niobium (Nb), titanium (Ti), nickel (Ni), steel, copper (Cu), stainless steel, aluminum (Al), etc. However, the lower supporting member 170 and the supporting pad 122 described with reference to the embodiment of FIG. 2 are illustrative, and are not limited to the above-described conditions. The lower supporting member 170 may include a material and a structure sufficient to cope with warpage of the semiconductor package 100. For example, in an embodiment, the lower supporting member 170 may have a circular shape, a cross shape, a triangular shape, etc., and may be disposed over the entirety of the lower substrate 110 or at a partial portion of the lower substrate 110. In an embodiment, a plurality of lower supporting members 170 may be disposed at a lower surface of the lower substrate 110. The plurality of lower support members 170 may be spaced apart from one another or may intersect one another.

The external connecting terminal 180 may be disposed under the lower substrate 110, and may directly contact the lower pad 115. The external connecting terminal 180 may be electrically connected to the semiconductor chip 130 through the lower substrate 110. In addition, the external connecting terminal 180 may be electrically connected to the upper substrate 140 through the lower substrate 110 and the conductive pillar CP. A lower end of the external connecting terminal 180 (e.g., a lowermost surface of the external connecting terminal 180) may be disposed at a lower level (e.g., in a thickness direction of the lower substrate 110) than a lower surface of the lower supporting member 170 (e.g., a lowermost surface of the lower supporting member 170) and a lower end of the supporting bonding member 172 (e.g., a lowermost surface of the supporting bonding member 172).

Figure 3:
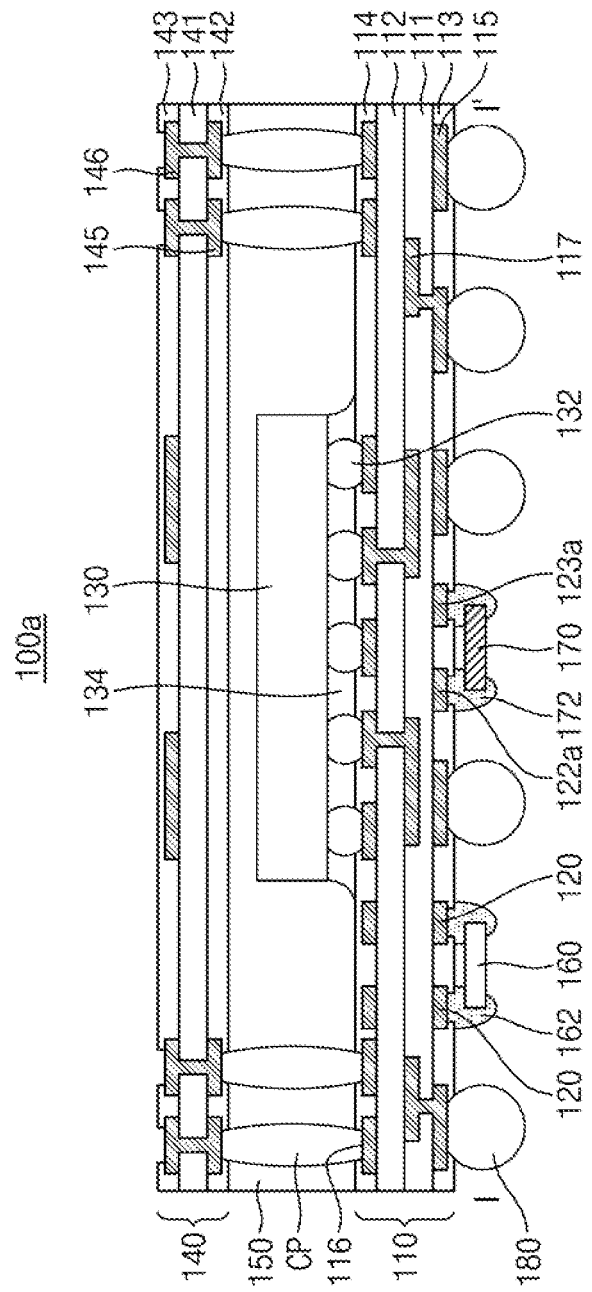
FIG. 3 is a cross-sectional view of a semiconductor package taken along line I-I' of FIG. 4 according to an embodiment of the present inventive concepts.
Figure 4:
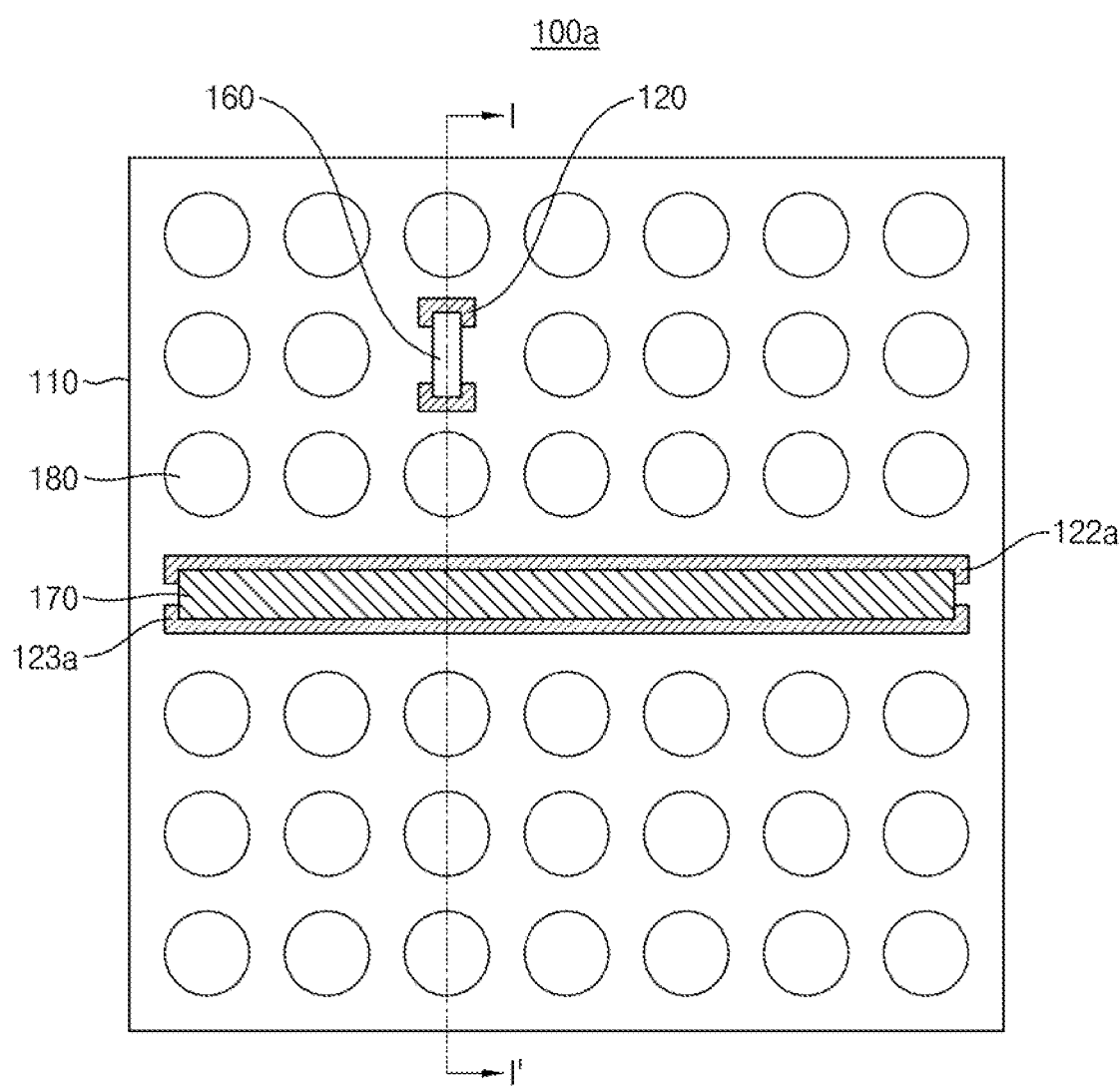
FIG. 4 is a plan view of the semiconductor package shown in FIG. 3 according to an embodiment of the present inventive concepts.

FIG. 3 is a vertical cross-sectional view of a semiconductor package according to an embodiment of the present inventive concepts. FIG. 4 is a plan view of the semiconductor package shown in FIG. 3. For example, FIG. 3 may correspond to a vertical cross-sectional view of a semiconductor package 100a taken along line I-I' in FIG. 4.

Referring to the embodiments of FIGS. 3 and 4, the semiconductor package 100a may include a plurality of supporting pads. For example, the semiconductor package 100a may include a first supporting pad 122a and a second supporting pad 123a, which are connected to a lower supporting member 170. The first supporting pad 122a and the second supporting pad 123a may be disposed on a lower surface of a lower substrate 110 and may be spaced apart from each other in a direction parallel to the lower surface of the lower substrate 110. For example, the first supporting pad 122a and the second supporting pad 123a may be spaced apart from each other in a width direction of the lower supporting member 170. Here, the width direction may mean a direction perpendicular to the longitudinal extending direction. A portion of a lower passivation layer 113 may be interposed between the first supporting pad 122a and the second supporting pad 123a. Each of the first supporting pad 122a and the second supporting pad 123a may be bonded to the lower supporting member 170 by a supporting bonding member 172. The supporting bonding members 172 bonding the first supporting pad 122a and the second supporting pad 123a to the lower supporting member 170, respectively, may be spaced apart from each other in the width direction.

Figure 5:
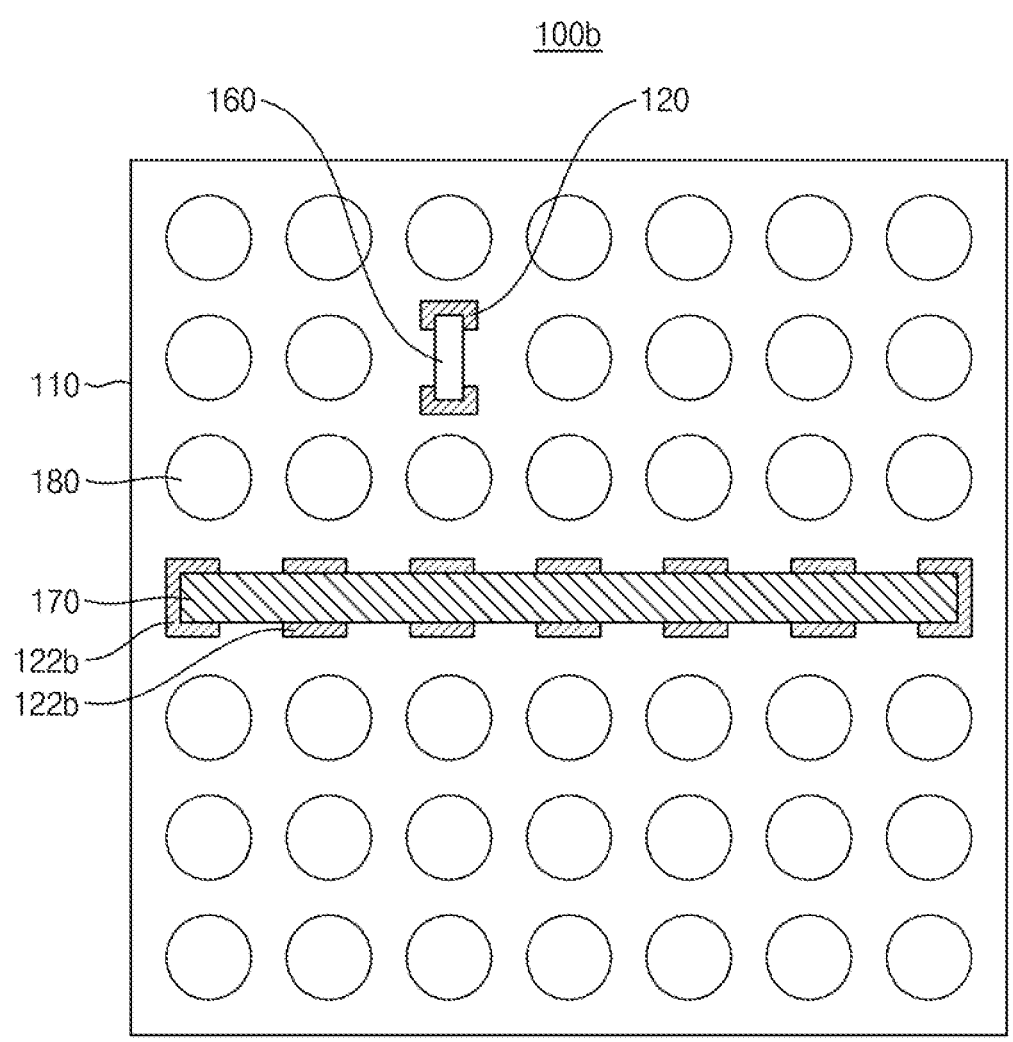
FIGS. 5 to 7 are plan views of semiconductor packages according to embodiments of the present inventive concepts.
Figure 6:
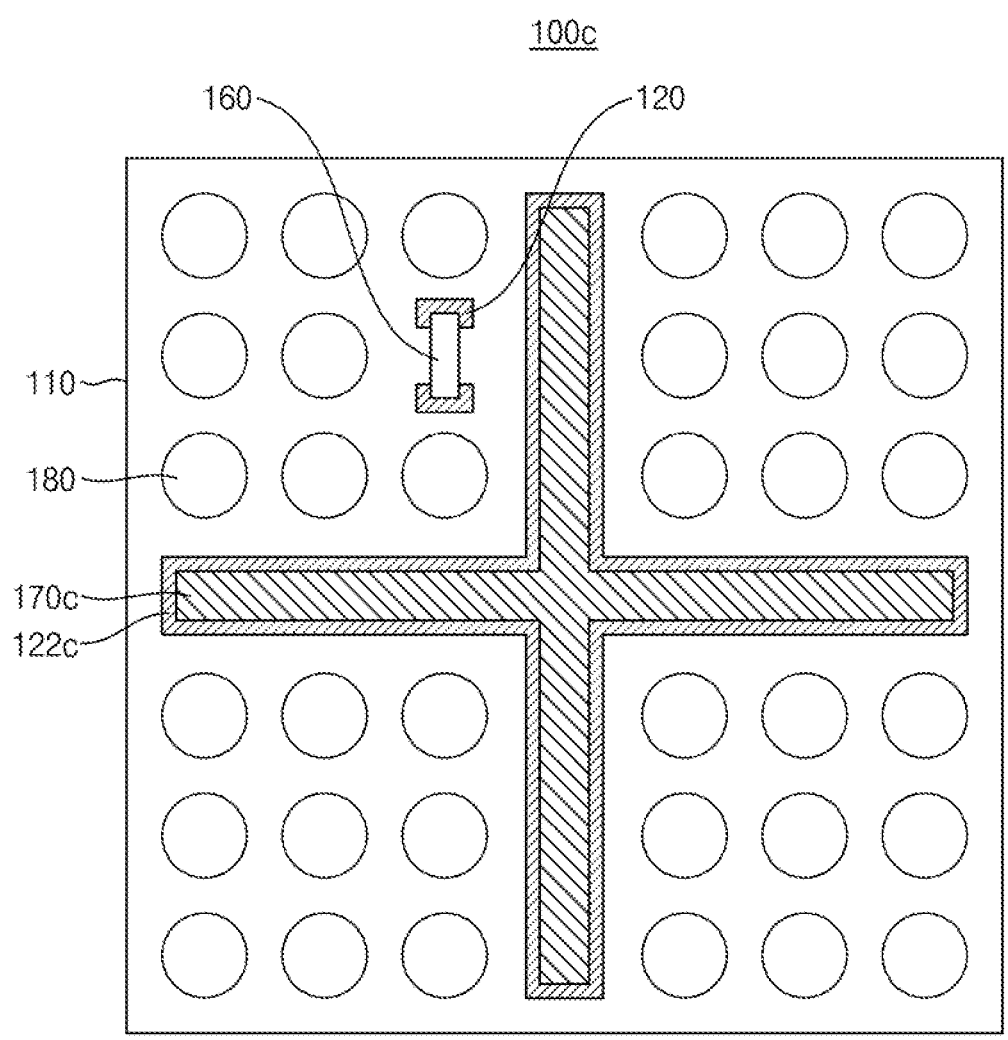
Figure 7:
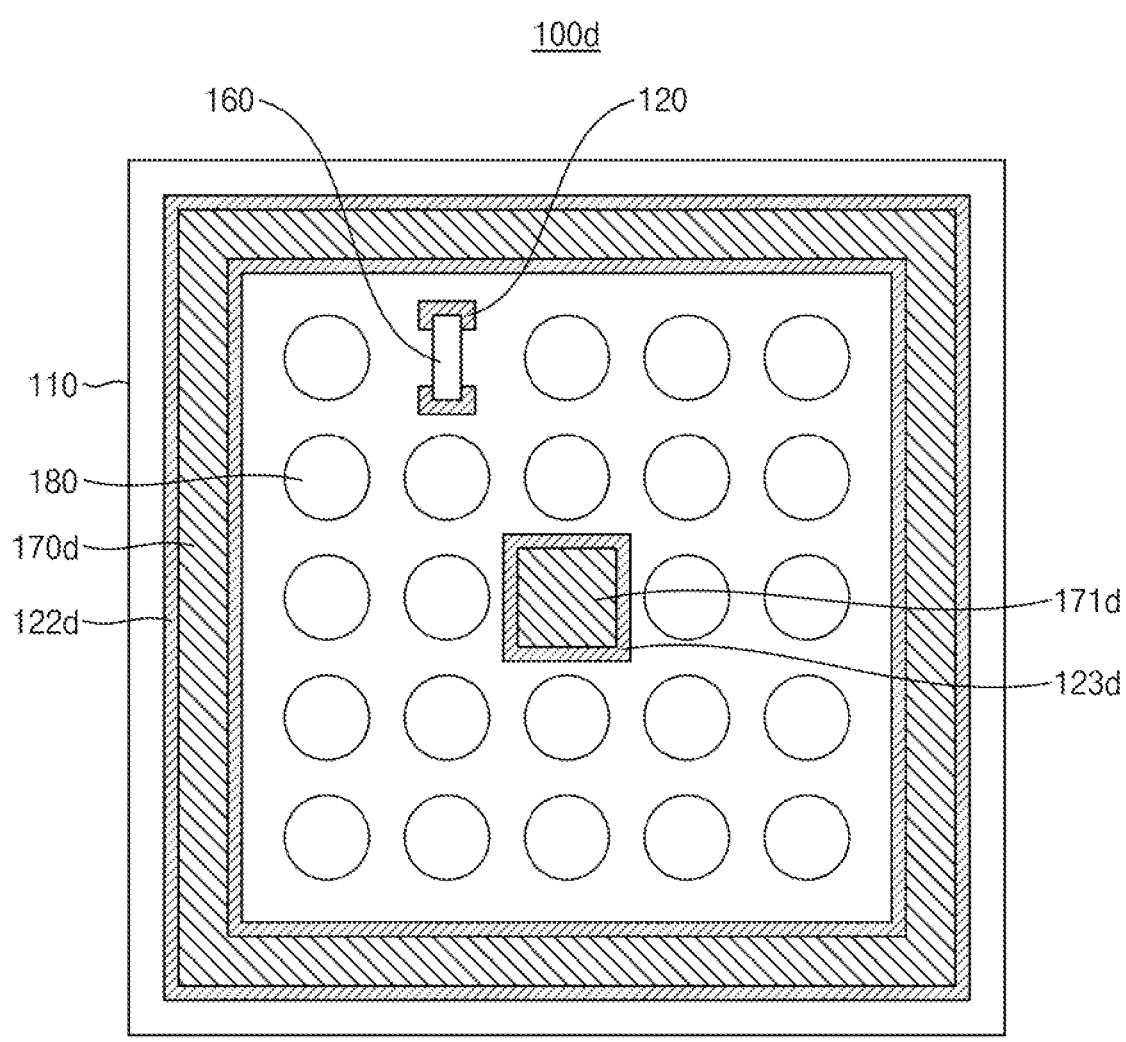

FIGS. 5 to 7 are plan views of semiconductor packages according to embodiments of the present inventive concepts.

Referring to the embodiment of FIG. 5, a semiconductor package 100b may include a plurality of supporting pads 122b connected to a lower supporting member 170. The lower supporting member 170 may extend longitudinally in one direction, and the plurality of supporting pads 122b may be disposed along the lower supporting member 170. For example, the plurality of supporting pads 122b may be disposed to be spaced apart from one another in the longitudinal extending direction of the lower supporting member 170. In an embodiment, a supporting bonding member 172 corresponding to each supporting pad 122b may be disposed between each supporting pad 122b and the lower supporting member 170 (e.g., in a thickness direction of the lower substrate 110). Although the plurality of supporting pads 122b are illustrated as being spaced apart from one another by the same distance in the embodiment of FIG. 5, the distance between adjacent supporting pads 122b may vary. Additionally, the number of the supporting pads 122 may vary. In addition, although the supporting pads 122b are illustrated as having the same size in FIG. 5, the supporting pads 122b are not limited thereto. For example, in an embodiment, the lengths of one or more of the supporting pads 122b (e.g., lengths in the longitudinal extending direction of the lower supporting member 170) may be different from the length of another supporting pad 122b.

Referring to the embodiment of FIG. 6, a semiconductor package 100c may include a lower supporting member 170c, and a supporting pad 122c connected to the lower supporting member 170c. In an embodiment, the lower supporting member 170c may have a shape in which bars respectively extending in intersecting directions that are both parallel to an upper surface of the lower substrate 110 may overlap with each other. The bars may intersect each other at a predetermined angle. For example, as shown in the embodiment of FIG. 6, the bars may extend in intersecting directions that are perpendicular to each other. However, embodiments of the present inventive concepts are not limited thereto. As shown in the embodiment of FIG. 6, the lower supporting member 170c may extend in two directions and, as such, may control warpage in the two directions.

The supporting pad 122c may be disposed along the lower supporting member 170c. In an embodiment, the supporting pad 122c may surround the lower supporting member 170c when viewed in a plan view. For example, as shown in the embodiment of FIG. 6, the supporting pad 122c may completely surround the lower supporting member 170c when viewed in a plan view. For example, the supporting pad 122c may extend longitudinally in two directions intersecting each other. However, embodiments of the present inventive concepts are not limited thereto. For example, in an embodiment, the semiconductor package 100c may include a plurality of supporting pads 122c, and the plurality of supporting pads 122 may be disposed along the lower supporting member 170c and are spaced apart from one another in the longitudinal extending direction of the lower supporting member 170c.

Referring to the embodiment of FIG. 7, a semiconductor package 100d may include an outer supporting member 170d, an inner supporting member 171d, an outer supporting pad 122d connected to the outer supporting member 170d, and an inner supporting pad 123d connected to the inner supporting member 171d. In an embodiment, the outer supporting member 170d may extend along an edge portion of a lower substrate 110. For example, as shown in the embodiment of FIG. 7, the outer supporting member 170d may extend along all four edges of the lower substrate 110. However, embodiments of the present inventive concepts are not limited thereto. For example, as shown in the embodiment of FIG. 7, the outer supporting member 170d may have a frame shape. When viewed in a plan view, a side surface of the outer supporting member 170d, such as an outer side surface of the outer supporting member 170d, may be disposed inside a side surface of the lower substrate 110, such as an edge of the lower substrate 110. The supporting pad 122d may extend longitudinally along the outer supporting member 170d. While the embodiment of FIG. 7 shows a continuous outer supporting pad 122d extending longitudinally along the outer supporting member 170d, in an embodiment, the semiconductor package 100d may include a plurality of outer supporting pads 122d connected to the outer supporting member 170d, and the plurality of outer supporting pads 122d may be disposed along the outer supporting member 170d and spaced apart from one another in a longitudinal extending direction of the outer supporting member 170d. The outer supporting member 170d may control warpage of the edge portion of the lower substrate 110.

In an embodiment, the inner supporting member 171d may be disposed at a central portion of the lower substrate 110. Although in the embodiment of FIG. 7 the inner supporting member 171d is illustrated as having a square shape, the shape of the inner supporting member 171d is not limited thereto and may various different shapes. When viewed in a plan view, the inner supporting pad 123d may be disposed to surround the inner supporting member 171d. For example, the inner supporting pad 123d may completely surround the inner supporting member 171d. The inner supporting member 171d may control warpage of the central portion of the lower substrate 110.

Figure 8:
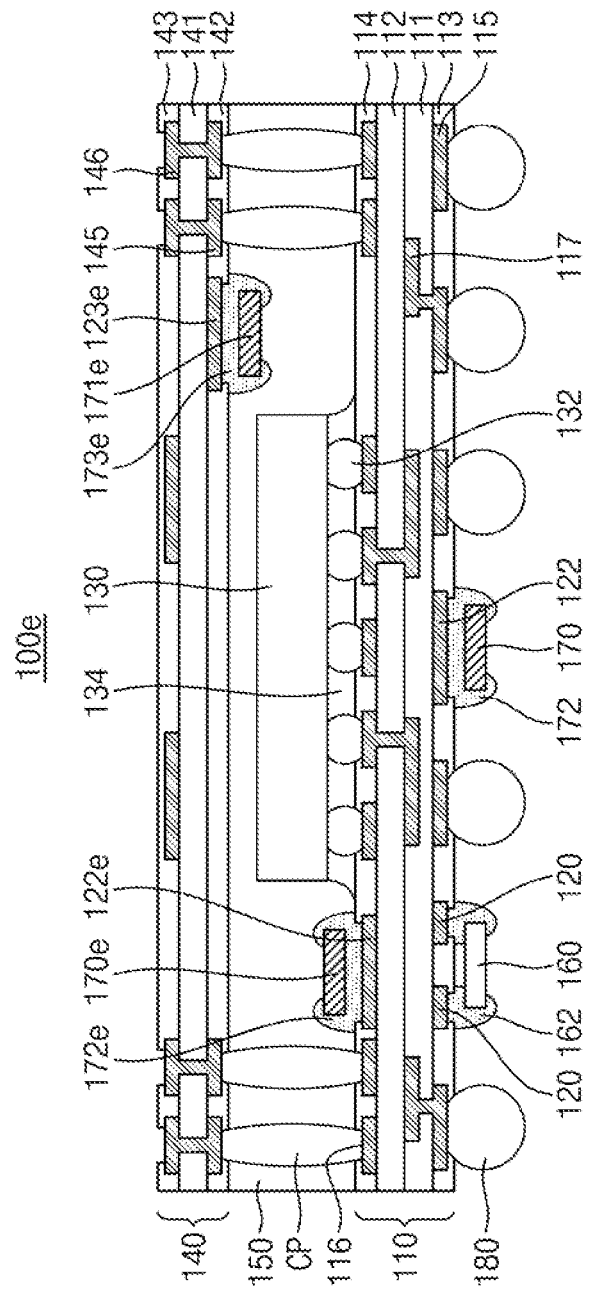
FIGS. 8 to 10 are cross-sectional views of semiconductor packages according to embodiments of the present inventive concepts.
Figure 9:
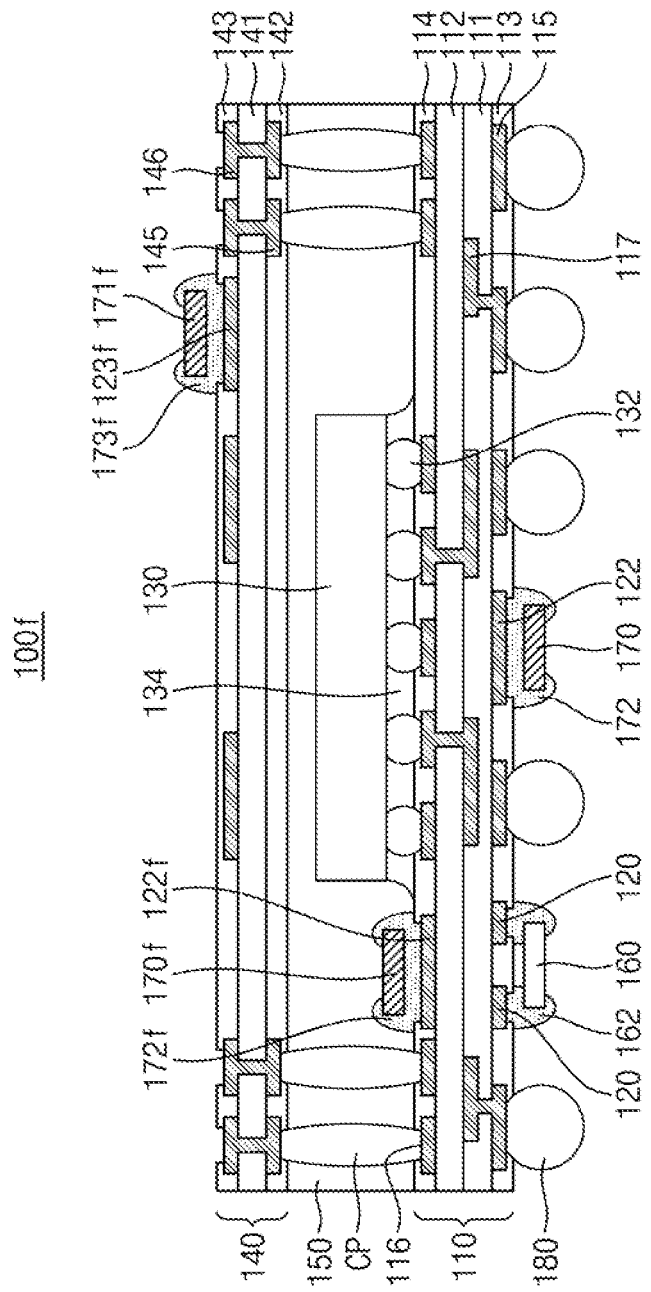
Figure 10:
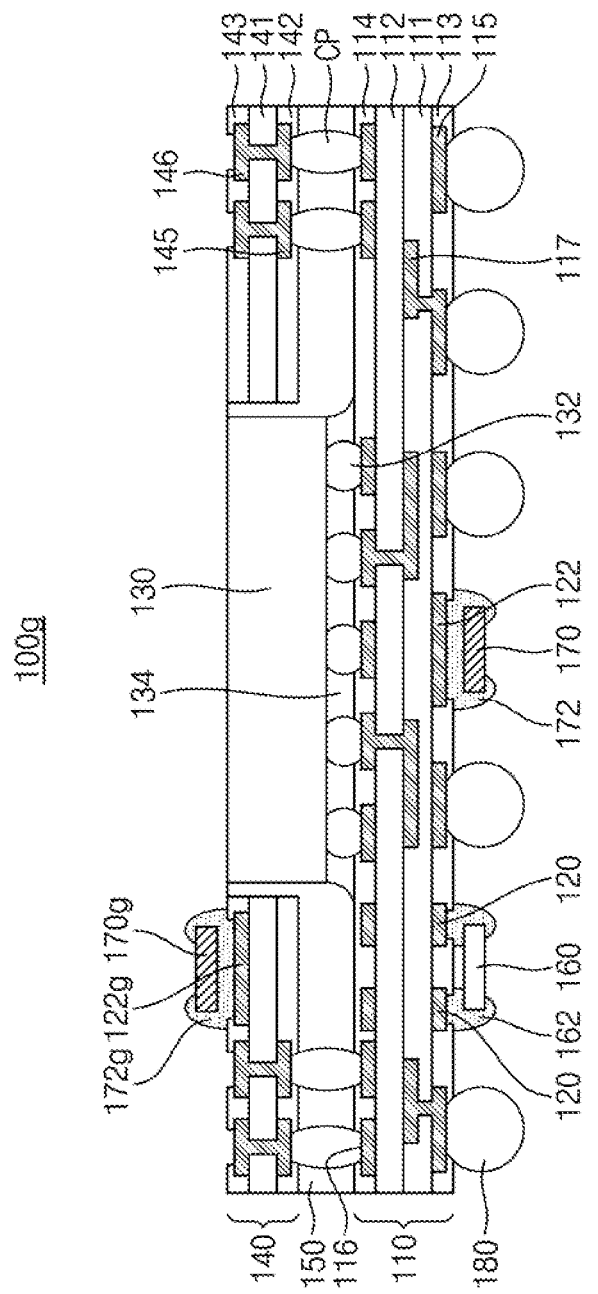

FIGS. 8 to 10 are vertical cross-sectional views of semiconductor packages according to embodiments of the present inventive concepts.

Referring to the embodiment of FIG. 8, a semiconductor package 100e may include a first lower supporting member 170 and a second lower supporting member 170e, which are attached to a lower substrate 110, and an upper supporting member 171e attached to an upper substrate 140. As shown in the embodiment of FIG. 8, the first lower supporting member 170 may be disposed on a lower surface of the lower substrate 110, and the second lower supporting member 170e may be disposed on an upper surface of the lower substrate 110. The second lower supporting member 170e may be connected to a second supporting pad 122e disposed on the upper surface of the lower substrate 110 by a second supporting bonding member 172e. The first lower supporting member 170 and the second lower supporting member 170e may control warpage of the lower substrate 110.

In an embodiment, the upper supporting member 171e may be disposed on a lower surface of the upper substrate 140. For example, the upper supporting member 171e may be connected to an upper supporting pad 123e disposed on the lower surface of the upper substrate 140 through an upper supporting bonding member 173e. The upper supporting member 171e may control warpage of the upper substrate 140. Although each of the first lower supporting member 170, the second lower supporting member 170e and the upper supporting member 171e are shown in the embodiment of FIG. 8, embodiments of the present inventive concepts are not limited thereto. For example, the semiconductor package 100e may include any combination of the first lower supporting member 170, the second lower supporting member 170e and the upper supporting member 171e.

The second lower supporting member 170e and the upper supporting member 171e may include materials and structures sufficient to cope with warpage of the lower substrate 110 and the upper substrate 140, respectively. For example, the lower supporting member 170, the second lower supporting member 170e and the upper supporting member 171e may include different materials, respectively. The second supporting pad 122e and the upper supporting pad 123e may include the same material as the supporting pad 122 disposed on the lower surface of the first insulating layer 111. The second supporting bonding member 172e and the upper supporting bonding member 173e may include the same material as the supporting bonding member 172 disposed between the lower supporting member 170 and the supporting pad 122.

Referring to the embodiment of FIG. 9, a semiconductor package 100f may include a lower supporting member 170 and a second lower supporting member 170f, which are attached to a lower substrate 110, and an upper supporting member 171f attached to an upper substrate 140. The lower supporting member 170 may be disposed on a lower surface of the lower substrate 110, and the second lower supporting member 170f may be disposed on an upper surface of the lower substrate 110. The second lower supporting member 170f may be connected to a second supporting pad 122f disposed at the upper surface of the lower substrate 110 by a second supporting bonding member 172f. In an embodiment, the upper supporting member 171f may be disposed on an upper surface of the upper substrate 140. For example, the upper supporting member 171f may be connected to an upper supporting pad 123f disposed on the upper surface of the upper substrate 140 through an upper supporting bonding member 173f. Although each of the lower supporting member 170, the second lower supporting member 170f and the upper supporting member 171f are shown in the embodiment of FIG. 9, embodiments of the present inventive concepts are not limited thereto. For example, the semiconductor package 100f may include any combination of the lower supporting member 170, the second lower supporting member 170f and the upper supporting member 171f.

Referring to the embodiment of FIG. 10, a semiconductor package 100g may include a semiconductor chip 130 exposed at an upper surface of the semiconductor package 100g. In an embodiment, an upper surface of an upper substrate 140 may be disposed at the same level as the upper surface of the semiconductor chip 130 (e.g., in a thickness direction of the lower substrate 110). In an embodiment, the upper substrate 140 may be formed as module structures which are mounted on a lower substrate 110. However, embodiments of the present inventive concepts are not limited thereto. For example, in an embodiment, the upper substrate 140 may have a structure in which a portion corresponding to the semiconductor chip 130 is empty to expose the semiconductor chip 130. For example, in an embodiment, side surfaces and a lower surface of the semiconductor chip 130 may be exposed by the upper substrate 140.

In an embodiment, an encapsulator 150 may fill a space between the lower substrate 110 and the upper substrate 140 and a space between the upper substrate 140 and the semiconductor chip 130. As shown in the embodiment of FIG. 10, an upper surface of the encapsulator 150 may be coplanar with the upper surface of the semiconductor chip 130. In an embodiment, the height of a conductive pillar CP may be less than the height of the semiconductor chip 130. For example, an upper surface of the conductive pillar CP may be disposed at a lower level than the upper surface of the semiconductor chip 130 (e.g., in a thickness direction of the lower substrate 110).

The semiconductor package 100g may include a lower supporting member 170 attached to the lower substrate 110, and an upper supporting member 170g attached to the upper substrate 140. The upper supporting member 170g may be disposed on the upper surface of the upper substrate 140. For example, the upper supporting member 170g may be connected to an upper supporting pad 122g disposed at the upper surface of the upper substrate 140 through an upper supporting bonding member 172g.

FIGS. 11 to 16 are vertical cross-sectional views illustrating in process order of a method of manufacturing a semiconductor package according to embodiments of the present inventive concepts.

Figure 11:
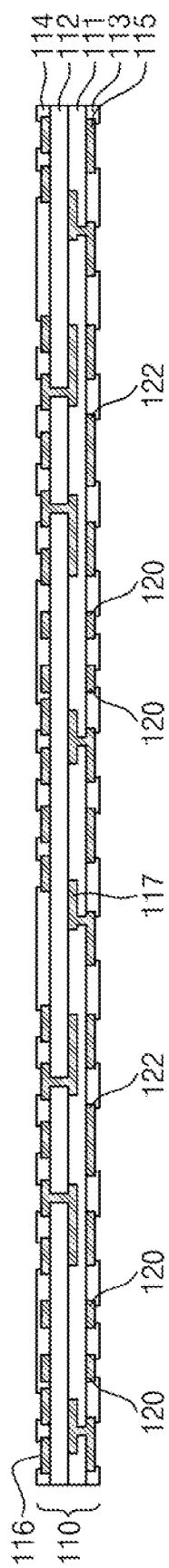
FIGS. 11 to 16 are cross-sectional views illustrating a method of manufacturing a semiconductor package according to embodiments of the present inventive concepts.

Referring to the embodiment of FIG. 11, a lower substrate 110 may be provided. The lower substrate may include a first insulating layer 111, a second insulating layer 112, a lower passivation layer 113, an upper passivation layer 114, a lower pad 115, an upper pad 116, and a wiring 117. The second insulating layer 112 may be disposed on the first insulating layer 111. The lower passivation layer 113 may be disposed at a lower side of the first insulating layer 111, and the upper passivation layer 114 may be disposed at an upper side of the second insulating layer 112. For example, an upper surface of the lower passivation layer 113 may directly contact a lower surface of the first insulating layer 111. A lower surface of the upper passivation layer 114 may directly contact an upper surface of the second insulating layer 112. The lower pad 115 may be disposed at a lower side of the first insulating layer 111, and may be partially covered by the lower passivation layer 113. The upper pad 116 may be disposed at the upper side of the second insulating layer 112, and may be partially covered by the upper passivation layer 114. The wiring 117 may be disposed in the first insulating layer 111 and the second insulating layer 112. The lower substrate 110 may further include an element pad 120 and a supporting pad 122. The element pad 120 and the supporting pad 122 may be partially covered by the lower passivation layer 113.

In an embodiment, the lower substrate 110 may be a printed circuit board. The first insulating layer 111 and the second insulating layer 112 may include an insulating material such as at least one compound selected from a phenolic resin, an epoxy resin, prepreg, etc. However, embodiments of the present inventive concepts are not limited thereto. For example, in an embodiment, the lower substrate 10 may be a redistribution layer having a stacked structure of an insulating material and a conductive material.

Each of the upper passivation layer 114 and the lower passivation layer 113 may include a photosensitive solder resist film. The photosensitive solder resist may include a photosensitive polymer. The photosensitive polymer may include at least one compound selected from photosensitive polyimide (PSPI), polybenzoxazole (PBO), a phenolic polymer and a benzocyclobutene-based polymer (BCB). The lower pad 115 and the upper pad 116 may include a metal such as at least one compound selected from aluminum (Al), titanium (Ti), chromium (Cr), iron (Fe), cobalt (Co), nickel (Ni), copper (Cu), zinc (Zn), lead (Pd), platinum (Pt), gold (Au) and silver (Ag). The wiring 117 may include copper (Cu), aluminum (Al), tungsten (W), nickel (Ni), titanium (Ti), titanium nitride (TiN), tantalum (Ta), tantalum nitride (TaN), gold (Au), or a combination thereof. In an embodiment, the element pad 120 and the supporting pad 122 may include the same material as the lower pad 115 and the upper pad 116.

Figure 12:
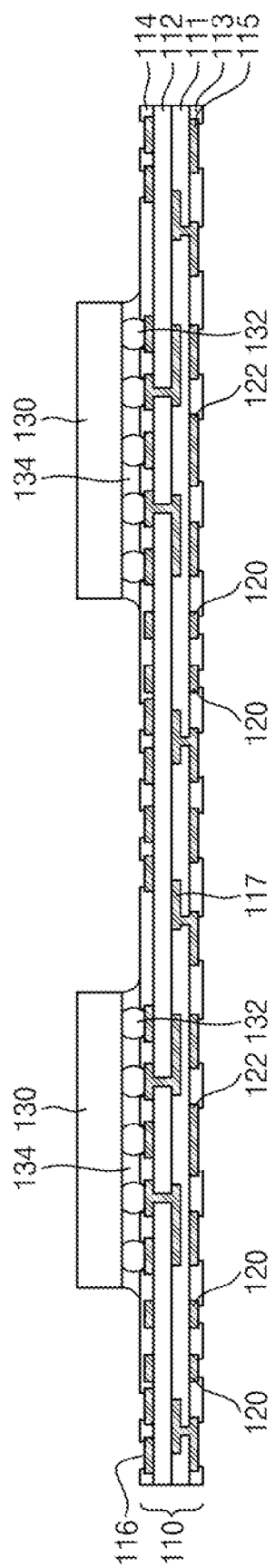

Referring to the embodiment of FIG. 12, a semiconductor chip 130 may be mounted on the lower substrate 110. In an embodiment, the semiconductor chip 130 may be mounted through flip-chip bonding. For example, the semiconductor chip 130 may be electrically connected to the upper pad 116 of the lower substrate 110 by a chip connecting terminal 132 disposed at a lower surface of the semiconductor chip 130. In an embodiment, the chip connecting terminal 132 may be a micro solder bump. An underfill 134 may be formed between the lower substrate 110 and the semiconductor chip 130 (e.g., in a thickness direction of the lower substrate 110). In an embodiment, the underfill 134 may include at least one material selected from a non-conductive paste (NCP), a non-conductive film (NCF), a capillary underfill (CUF), or other insulating materials. However, embodiments of the present inventive concepts are not limited thereto.

In an embodiment, the semiconductor chip 130 may include an application processor (AP) chip such as a microprocessor or a microcontroller, or a logic chip such as a CPU, a GPU, a modem, an application-specific integrated circuit (ASIC), a field programmable gate array (FPGA), etc.

Figure 13:
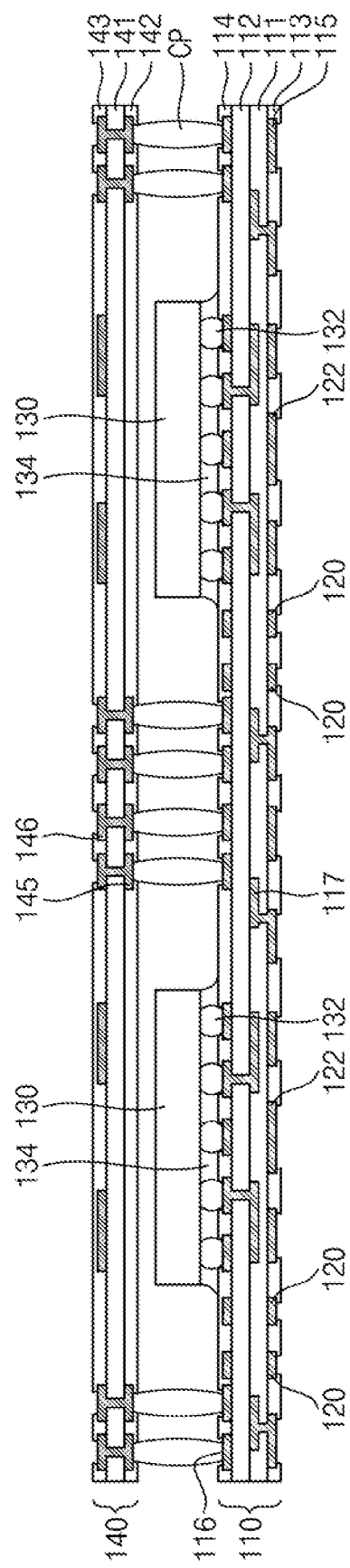

Referring to the embodiment of FIG. 13, an upper substrate 140 and a conductive pillar CP may be attached to an upper surface of the lower substrate 110. As shown in the embodiment of FIG. 13, the upper substrate 140 may include a third insulating layer 141, a lower passivation layer 142, an upper passivation layer 143, a lower pad 145, and an upper pad 146. The lower passivation layer 142 and the upper passivation layer 143 may be disposed at lower and upper sides of the third insulating layer 141, respectively. The lower pad 145 may be disposed at the lower side of the third insulating layer 141, and may be partially covered by the lower passivation layer 142. The upper pad 146 may be disposed at the upper side of the third insulating layer 141, and may be partially covered by the upper passivation layer 143. The lower pad 145 may be electrically connected to the conductive pillar CP.

In an embodiment, the process of attaching the upper substrate 140 to the lower substrate 110 may include forming the conductive pillar CP on the upper substrate 140, inverting the upper substrate 140 such that the conductive pillar CP is directed downwardly towards the lower substrate 110, and connecting the connective pillar CP to the upper pad 116 of the lower substrate 110 such that the connective pillar CP directly contacts the upper pad 116.

In an embodiment, the upper substrate 140 may be a printed circuit board. However, embodiments of the present inventive concepts are not limited thereto. For example, in an embodiment, the upper substrate 140 may be a redistribution layer having a stacked structure of an insulating material and a conductive material. In an embodiment, the conductive pillar CP may be formed through printing, electroplating, electroless plating, chemical vapor deposition (CVD), etc. In an embodiment, the conductive pillar CP may include solder. However, embodiments of the present inventive concepts are not limited thereto. The conductive pillar CP may further include a metal pillar disposed therein. The metal pillar may include, for example, copper. However, embodiments of the present inventive concepts are not limited thereto and the materials of the conductive pillar CP may vary.

Figure 14:
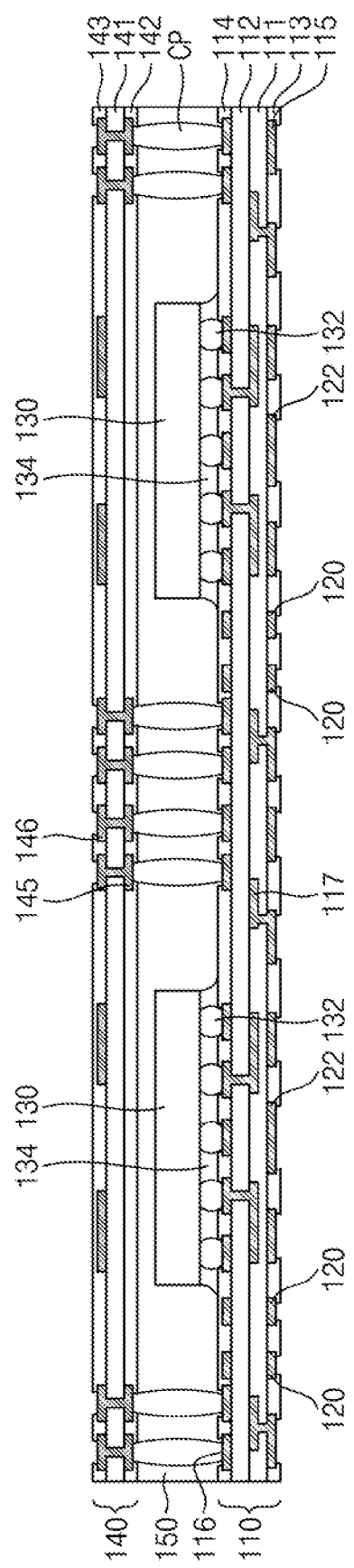

Referring to the embodiment of FIG. 14, an encapsulator 150 may be formed between the lower substrate 110 and the upper substrate 140. For example, in an embodiment, the encapsulator 150 may be formed through a transfer molding process. The encapsulator 150 may cover the lower substrate 110, the conductive pillar CP and the semiconductor chip 130. An upper surface of the encapsulator 150 may directly contact a lower surface of the upper substrate 140.

In an embodiment, the encapsulator 150 may be a resin including epoxy or polyimide. For example, the encapsulator 150 may include at least one material selected from a bisphenol-group epoxy resin, a polycyclic aromatic epoxy resin, an o-cresol novolac epoxy resin, a biphenyl-group epoxy resin, a naphthalene-group epoxy resin, etc. However, embodiments of the present inventive concepts are not limited thereto.

Figure 15:
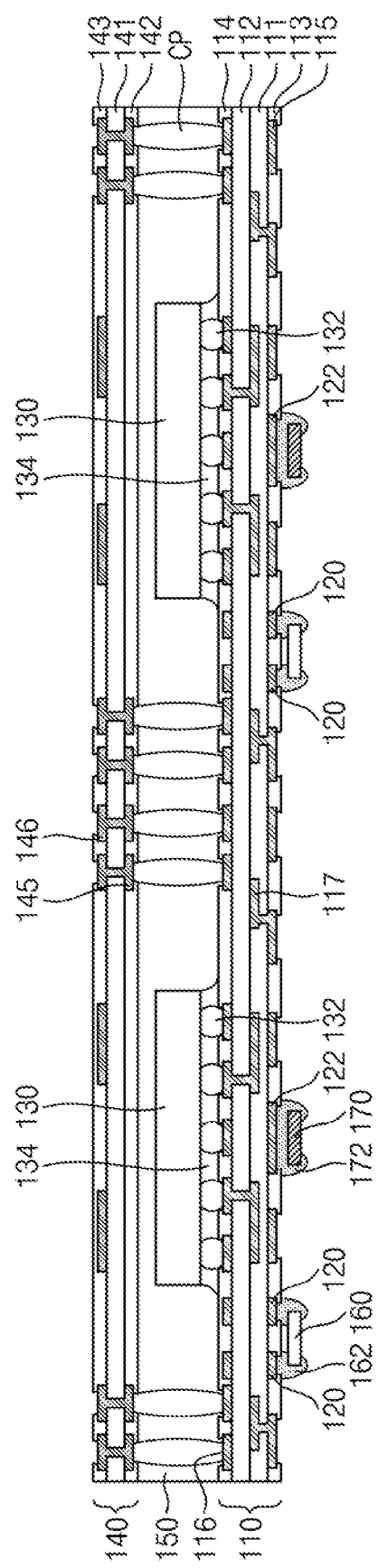

Referring to the embodiment of FIG. 15, an element 160 and a lower supporting member 170 may be formed under the lower substrate 110. In an embodiment, the formation of the element 160 may include forming an element bonding member 162 such that the element bonding member 162 directly contacts the element 160 and the element pad 120, and reflowing the element bonding member 162, thereby bonding the element 160 to the element pad 120.

In an embodiment, the lower supporting member 170 and the element 160 may be simultaneously formed. For example, upon forming the element bonding member 162, the supporting bonding member 172 may be formed to contact the lower supporting member 170 and the supporting pad 122. When the element bonding member 162 reflows, the supporting bonding member 172 may also be reflowed. The lower supporting member 170 may include a material and a structure sufficient to cope with warpage of the resultant semiconductor package. For example, the lower supporting member 170 may include a material having a low coefficient of thermal expansion such as $SiO_2$ and W, or may include a material having a high coefficient of thermal expansion such as Cu and Al. However, embodiments of the present inventive concepts are not limited thereto.

As described above, the process of forming the lower supporting member 170 is performed simultaneously with the process of forming the element 160 and, as such, may be simplified, and the costs thereof may be reduced.

Figure 16:
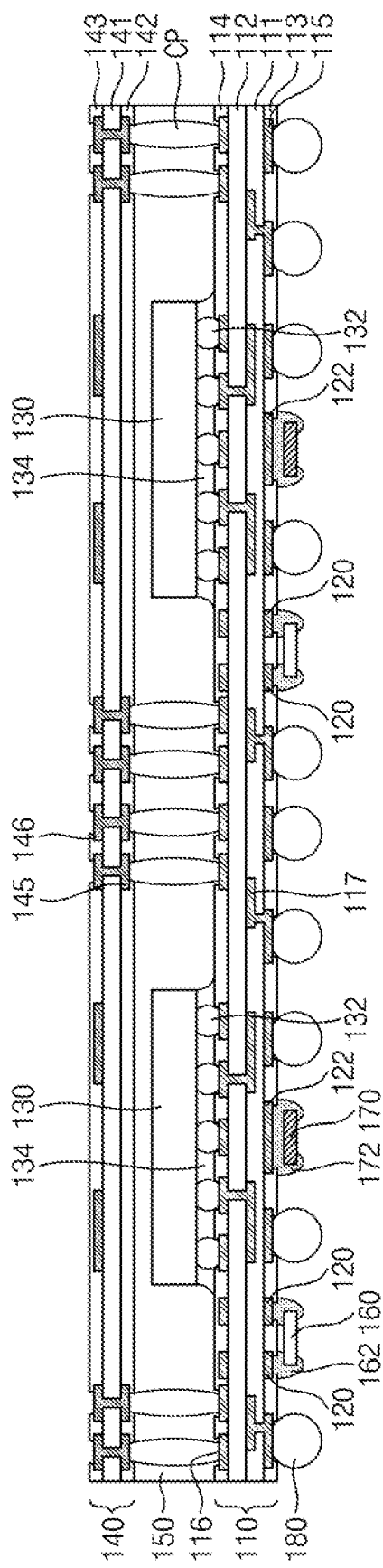

Referring to the embodiment of FIG. 16, an external connecting terminal 180 may be formed under the lower substrate 110. In an embodiment, the formation of the external connecting terminal 180 may include forming a conductive material contacting the lower pad 115, and reflowing the conductive material. However, embodiments of the present inventive concepts are not limited thereto. The external connecting terminal 180 may include solder.

Again referring to the embodiment of FIG. 1, a sorting process may be performed after formation of the external connecting terminal 180. For example, the resultant product of the embodiment of FIG. 16 may be diced along a scribe line by a dicing blade and, as such, a semiconductor package ("100" in FIG. 1) may be formed.

Figure 17:
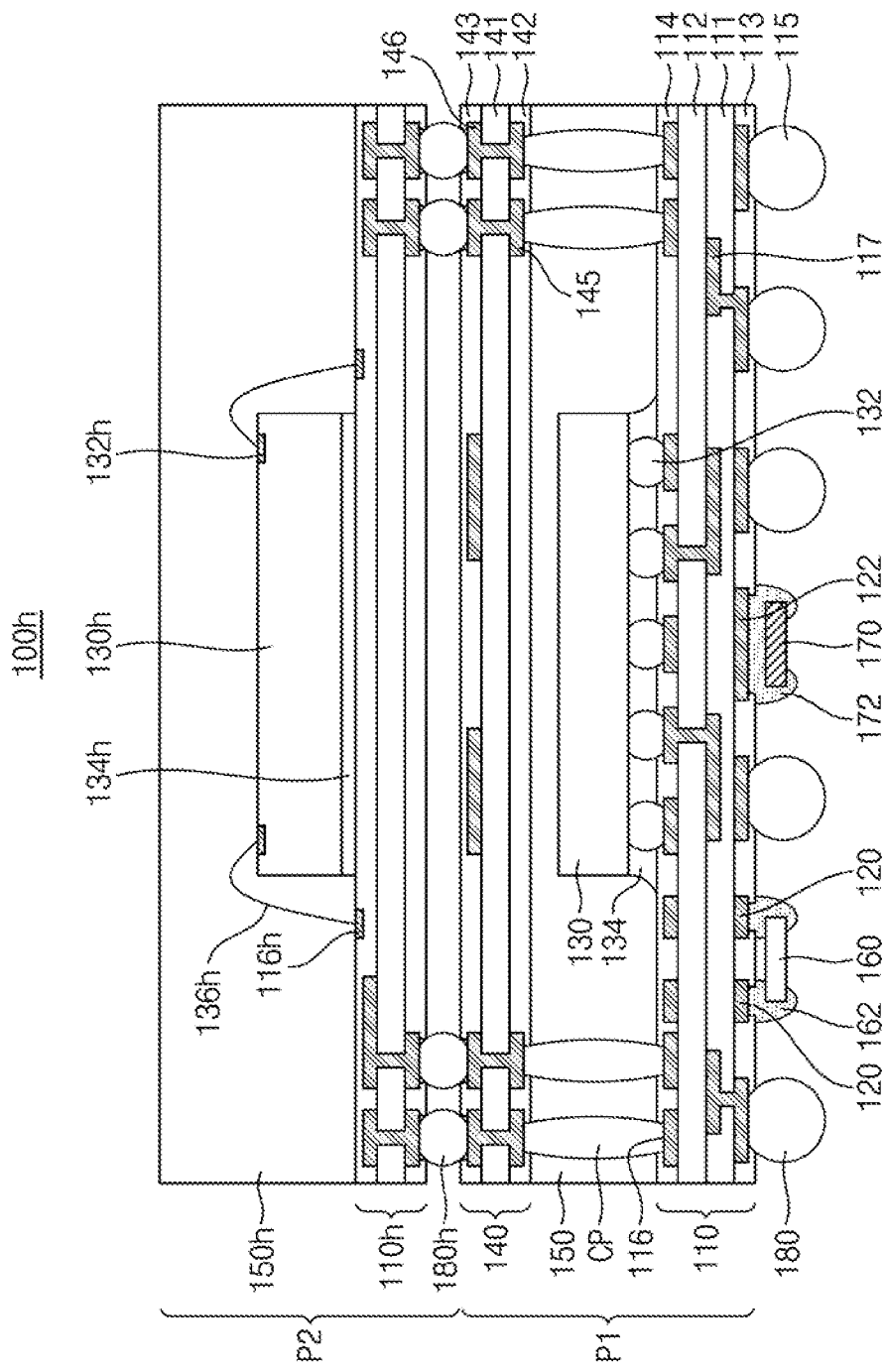
FIGS. 17 and 18 are cross-sectional views of semiconductor packages according to embodiments of the present inventive concepts.
Figure 18:
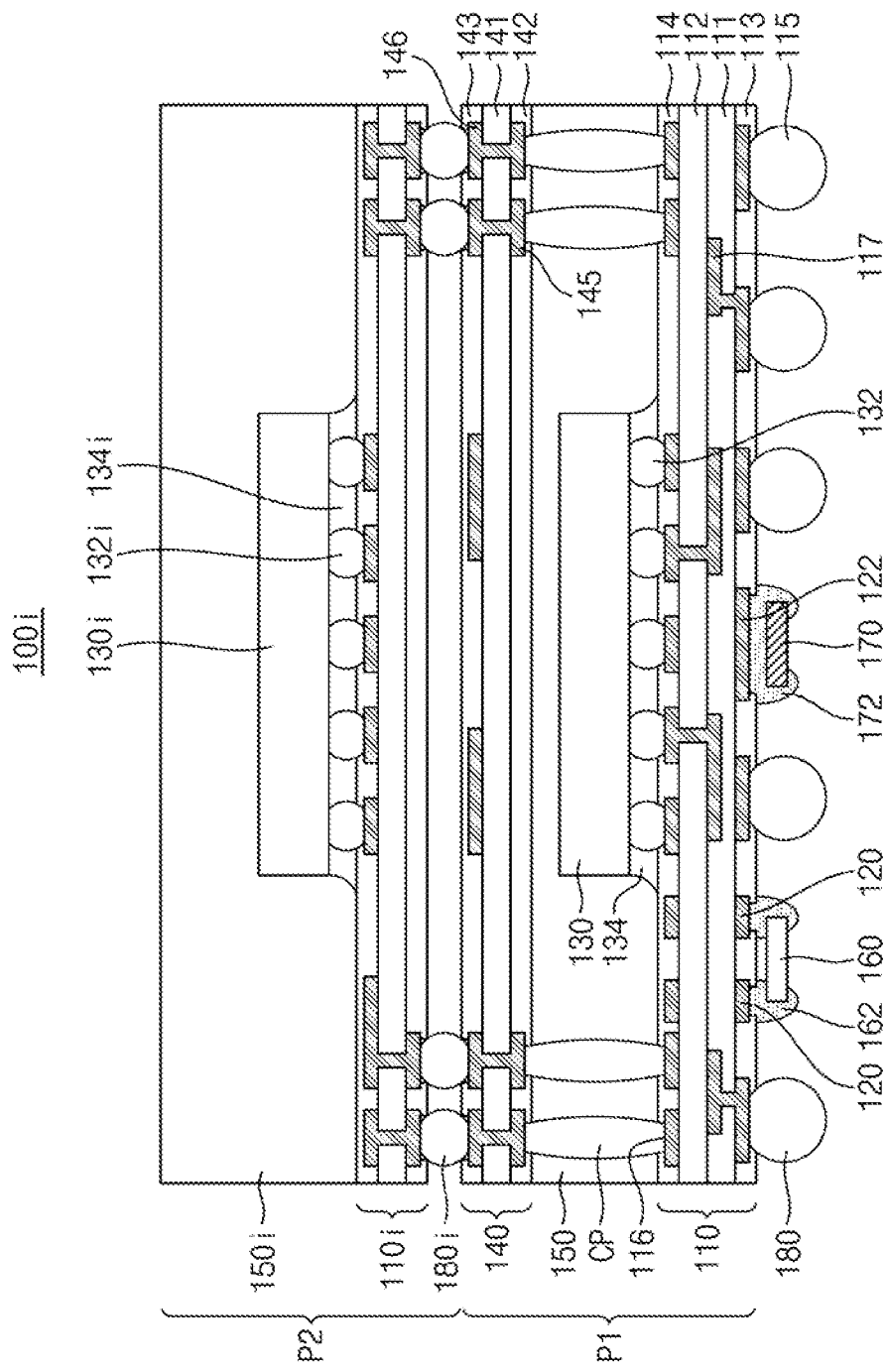

FIGS. 17 and 18 are vertical cross-sectional views of semiconductor packages according to embodiments of the present inventive concepts.

Referring to the embodiment of FIG. 17, a semiconductor package 100h may have a package-on-package structure. For example, the semiconductor package 100h may include a first package P1, and a second package P2 disposed on the first package P1. The first package P1 may include a structure identical or similar to the semiconductor package 100 described with reference to the embodiment of FIG. 1. For example, the first package P1 may include a lower substrate 110, an element pad 120, a semiconductor chip 130, an upper substrate 140, an encapsulator 150, an element 160, and a lower supporting member 170.

The second package P2 may include a package substrate 110h, a semiconductor chip 130h, a chip pad 132h, a bonding member 134h, a wire 136h, a second encapsulator 150h, and a package connecting terminal 180h. In an embodiment, the semiconductor chip 130h may be mounted on the package substrate 110h through wire bonding. For example, the chip pad 132h may be disposed at an upper side of the semiconductor chip 130h, and the wire 136h may electrically interconnect the upper pad 116h on the package substrate 110h and the chip pad 132h disposed on the upper side of the semiconductor chip 130h. The bonding member 134h may be disposed between the package substrate 110h and the semiconductor chip 130h, and may affix the semiconductor chip 130h to the package substrate 110h. In an embodiment, the semiconductor chip 130 of the first package P1 and the semiconductor chip 130h of the second package P2 may be semiconductor devices of different kinds, respectively. For example, the semiconductor chip 130 may include an application processor chip such as a microprocessor, a microcontroller, etc. or a logic chip such as a CPU, a GPU, a modem, an ASIC, an FPGA, etc. The semiconductor chip 130h may include a volatile memory chip such as DRAM or a non-volatile memory chip such as flash memory. However, embodiments of the present inventive concepts are not limited thereto.

The second encapsulator 150h may cover the package substrate 110h and the semiconductor chip 130h. For example, as shown in the embodiment of FIG. 17, the second encapsulator 150h may cover an upper surface of the package substrate 110h and an upper surface and side surfaces of the semiconductor chip 130h. In an embodiment, the second encapsulator 150h may include the same material as the encapsulator 150. The package connecting terminal 180h may be disposed at a lower side of the package substrate 110b, and may directly contact the upper substrate 140 of the first package P1. The semiconductor chip 130h may be electrically connected to the first package P1 through the package connecting terminal 180h. In an embodiment, the package connecting terminal 180h may include the same material as an external connecting terminal 180.

Referring to the embodiment of FIG. 18, a semiconductor package 100i may include a first package P1, and a second package P2 disposed on the first package P1. As shown in the embodiment of FIG. 18, the second package P2 may include a package substrate 110i, a semiconductor chip 130i, a chip connecting terminal 132i, an underfill 134i, an encapsulator 150i, and a package connecting terminal 180i. In an embodiment, the semiconductor chip 130i may be mounted on a package substrate 110i through flip-chip bonding. For example, the chip connecting terminal 132i may be disposed at a lower side of the semiconductor chip 130i, and may electrically interconnect the package substrate 110i and the semiconductor chip 130i. The underfill 134i may cover the chip connecting terminal 132i, and may fill a space between the package substrate 110i and the semiconductor chip 130i (e.g., in a thickness direction of the package substrate 110i).

In accordance with an embodiment of the present inventive concepts, the lower supporting member disposed under the lower substrate may control warpage of the semiconductor package.

While embodiments of the present inventive concepts have been described with reference to the accompanying drawings, it should be understood by those skilled in the art that various modifications may be made without departing from the scope of the present inventive concepts and without changing essential features thereof. Therefore, the above-described embodiments should be considered in a descriptive sense only and not for purposes of limitation.

What is claimed is:

1. A semiconductor package comprising:
    a lower substrate including a lower passivation layer, a lower pad, element pads and a supporting pad that are disposed on a lower surface of the lower substrate, wherein the lower passivation layer partially covers the lower pad, the element pads and the supporting pad;
    a semiconductor chip disposed on an upper surface of the lower substrate;
    an upper substrate disposed on the semiconductor chip and connected to the lower substrate;
    an encapsulator disposed between the lower substrate and the upper substrate;
    an element disposed on the lower surface of the lower substrate, the element is bonded to the element pads by an element bonding member, the element bonding member directly contacts an upper surface, a lower surface and side surfaces of the element;
    a lower supporting member disposed on the lower surface of the lower substrate; and
    a supporting bonding member bonding the lower supporting member to the supporting pad, the supporting bonding member directly contacts an upper surface, a lower surface and side surfaces of the lower supporting member.

2. The semiconductor package according to claim 1, wherein the supporting bonding member partially covers the lower surface of the supporting pad.

3. The semiconductor package according to claim 1, wherein a lowermost surface of the supporting pad is disposed at a higher level than a lowermost surface of the lower passivation layer.

4. The semiconductor package according to claim 1, wherein uppermost surfaces of the lower pad, the element pads and the supporting pad are disposed at a same level as each other.

5. The semiconductor package according to claim 1, wherein the supporting bonding member includes solder.

6. The semiconductor package according to claim 1, wherein the supporting pad surrounds the lower supporting member when viewed in a plan view.

7. The semiconductor package according to claim 1, wherein the supporting pad extends in a first direction that is a longitudinal extending direction of the lower supporting member.

8. The semiconductor package according to claim 1, wherein:
    the supporting pad includes a plurality of supporting pads; and
    each of the plurality of supporting pads is spaced apart from one another in a width direction of the lower supporting member.

9. The semiconductor package according to claim 8, wherein the lower passivation layer is interposed between the plurality of supporting pads.

10. The semiconductor package according to claim 1, wherein:
- the supporting pad includes a plurality of supporting pads; and
- each of the plurality of supporting pads is spaced apart from one another in a first direction that is a longitudinal extending direction of the lower supporting member.

11. The semiconductor package according to claim 1, wherein the lower supporting member includes an outer supporting member extending along an edge portion of the lower substrate, and an inner supporting member disposed at a central portion of the lower substrate.

12. The semiconductor package according to claim 1, wherein the element bonding member includes a same material as the supporting bonding member.

13. The semiconductor package according to claim 1, further comprising:
- an external connecting terminal directly contacting the lower pad,
- wherein a lowermost surface of the external connecting terminal is disposed at a lower level than a lowermost surface of the lower supporting member.

14. A semiconductor package comprising:
- a lower substrate including a lower passivation layer, a lower pad, element pads and a supporting pad that are disposed on a lower surface of the lower substrate, wherein the lower passivation layer partially covers the lower pad, the element pads and the supporting pad;
- a semiconductor chip disposed on an upper surface of the lower substrate;
- an upper substrate disposed on the semiconductor chip and connected to the lower substrate;
- an encapsulator disposed between the lower substrate and the upper substrate;
- an element disposed on the lower surface of the lower substrate and bonded to the element pads by an element bonding member the element bonding member directly contacts an upper surface, a lower surface and side surfaces of the element;
- a first lower supporting member disposed on the lower surface of the lower substrate;
- a second lower supporting member disposed on the upper surface of the lower substrate; and
- a first supporting bonding member bonding the first lower supporting member to the supporting pad, the first supporting bonding member directly contacts an upper surface a lower surface and side surfaces of the first lower supporting member.

15. The semiconductor package according to claim 14, further comprising:
- a second supporting pad disposed on the upper surface of the lower substrate; and
- a second supporting bonding member bonding the second lower supporting member to the second supporting pad.

16. The semiconductor package according to claim 15, further comprising:
- an upper passivation layer disposed on the upper surface of the lower substrate,
- wherein the upper passivation layer partially covers the second supporting pad.

17. The semiconductor package according to claim 14, further comprising:
- an upper supporting pad disposed on a lower surface of the upper substrate; and
- an upper supporting member disposed on the lower surface of the upper substrate and connected to the upper supporting pad through an upper supporting bonding member.

18. The semiconductor package according to claim 14, further comprising
- an upper supporting pad disposed on an upper surface of the upper substrate; and
- an upper supporting member disposed on the upper surface of the upper substrate and connected to the upper supporting pad through an upper supporting bonding member.

19. A semiconductor package comprising:
- a first package including
  - a lower substrate including a lower passivation layer, a lower pad, element pads and a supporting pad that are disposed on a lower surface of the lower substrate, the lower passivation layer partially covers the lower pad, the element pads and the supporting pad,
  - a first semiconductor chip disposed on an upper surface of the lower substrate,
  - an upper substrate disposed on the first semiconductor chip and connected to the lower substrate,
  - an encapsulator disposed between the lower substrate and the upper substrate,
  - an element disposed on the lower surface of the lower substrate, the element is bonded to the element pads by an element bonding member, the element bonding member directly contacts an upper surface, a lower surface and side surfaces of the element,
  - a lower supporting member disposed on the lower surface of the lower substrate, and
  - a supporting bonding member bonding the lower supporting member to the supporting pad, the supporting bonding member directly contacts an upper surface, a lower surface and side surfaces of the lower supporting member; and
- a second package disposed on the first package,
- wherein the second package includes a package substrate, a second semiconductor chip disposed on the package substrate, and a package connecting terminal interconnecting the package substrate and the upper substrate.

20. The semiconductor package of claim 1, wherein the element and the lower supporting member are formed by simultaneously reflowing the element bonding member and the supporting bonding member.

* * * * *